(12) United States Patent
Quenzer et al.

(10) Patent No.: US 11,531,196 B2
(45) Date of Patent: Dec. 20, 2022

(54) MEMS MIRROR ARRANGEMENT FOR DETECTING A LARGE ANGULAR RANGE

(71) Applicant: Fraunhofer-Gesellschaft zur Förderung der angewandten Forschung e.V., Munich (DE)

(72) Inventors: Hans-Joachim Quenzer, Itzehoe (DE); Ulrich Hofmann, Itzehoe (DE); Vanessa Stenchly, Meldorf (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 436 days.

(21) Appl. No.: 16/634,420

(22) PCT Filed: Jul. 25, 2018

(86) PCT No.: PCT/EP2018/070215
§ 371 (c)(1),
(2) Date: Jan. 27, 2020

(87) PCT Pub. No.: WO2019/020708
PCT Pub. Date: Jan. 31, 2019

(65) Prior Publication Data
US 2020/0159006 A1 May 21, 2020

(30) Foreign Application Priority Data
Jul. 28, 2017 (DE) ...................... 10 2017 213 070.9

(51) Int. Cl.
*G02B 26/08* (2006.01)
*B81B 7/00* (2006.01)
(Continued)

(52) U.S. Cl.
CPC ........ *G02B 26/0833* (2013.01); *B81B 7/0067* (2013.01); *B81C 1/00317* (2013.01);
(Continued)

(58) Field of Classification Search
None
See application file for complete search history.

(56) References Cited

U.S. PATENT DOCUMENTS

2007/0071922 A1 3/2007 Eklund et al.
2008/0239531 A1 10/2008 Schenk et al.
(Continued)

FOREIGN PATENT DOCUMENTS

CN 1659684 8/2005
CN 101143702 3/2008
(Continued)

OTHER PUBLICATIONS

"Chinese Application Serial No. 201880049871.9, Office Action dated Dec. 28, 2021", w English Translation, (dated Dec. 28, 2021), 14 pgs.
(Continued)

*Primary Examiner* — Elmito Breval
(74) *Attorney, Agent, or Firm* — Schwegman Lundberg & Woessner, P.A.

(57) ABSTRACT

The invention relates to a MEMS mirror assembly for detecting a large angular range up to 180°, preferably up to 160°, and to a method for producing a MEMS mirror assembly. The mirror assembly comprises a carrier substrate (1), on which a mirror (2) vibrating about at least one axis is mounted, a transparent cover (4), which is connected in a hermetically sealed manner to the carrier substrate (1) and which comprises an ellipsoidal dome (6) having a substantially round base area, and a compensation optical system (8), which is arranged in a predefined beam path for an incident beam outside the dome (6). The middle of the mirror (2) lies in the centre point of the dome, and the compensation optical system (8) collimates the incident beam in such a way that a divergence or convergence of the beam caused by the boundary surfaces of the dome once said
(Continued)

Figure 1:
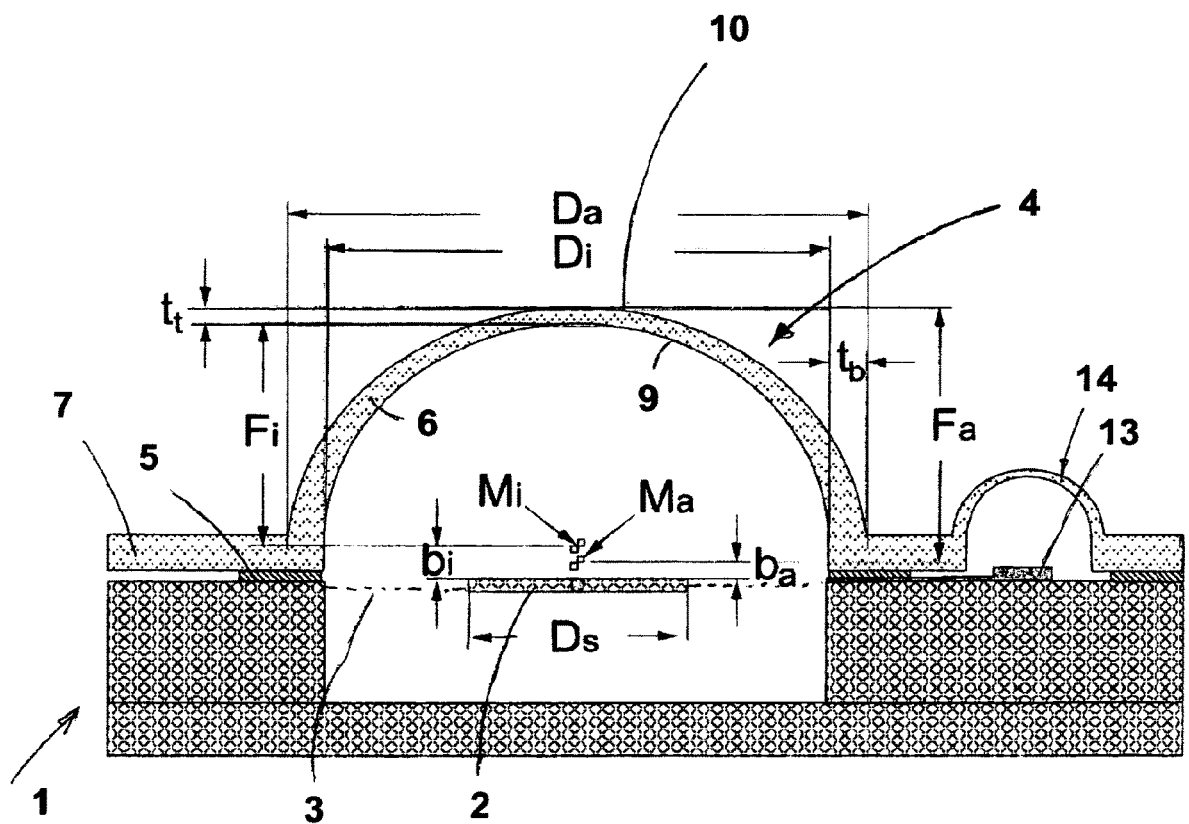

beam has exited from the dome (6) is substantially compensated. The MEMS mirror assemblies are produced by joining a cover wafer and a mirror wafer, which each comprise a plurality of hemispherical domes and mirrors mounted on the carrier substrate. The mirror assemblies are then separated from the joined wafers. The domes of the cover wafer are produced by a glass flow process.

23 Claims, 5 Drawing Sheets

(51) Int. Cl.
  *B81C 1/00* (2006.01)
  *G02B 26/10* (2006.01)
(52) U.S. Cl.
  CPC . *B81B 2201/042* (2013.01); *B81C 2203/0109* (2013.01); *G02B 26/10* (2013.01); *G02B 26/105* (2013.01)

(56) References Cited

U.S. PATENT DOCUMENTS

| | | | |
|---|---|---|---|
| 2008/0280124 A1 | 11/2008 | Eklund et al. | |
| 2009/0290205 A1 | 11/2009 | Satoh et al. | |
| 2015/0131034 A1 | 5/2015 | Cho et al. | |

FOREIGN PATENT DOCUMENTS

| | | |
|---|---|---|
| CN | 101281295 | 10/2008 |
| CN | 101734612 A | 6/2010 |
| CN | 101863449 | 10/2010 |
| CN | 101885466 | 11/2010 |
| CN | 102976265 | 3/2013 |
| CN | 102569563 B | 12/2013 |
| CN | 104093552 | 10/2014 |
| CN | 104871029 A | 8/2015 |
| CN | 105050475 | 11/2015 |
| CN | 103901615 | 5/2016 |
| CN | 111373278 | 7/2020 |
| DE | 10313889 | 8/2004 |
| DE | 102008012384 A1 | 9/2009 |
| DE | 102010018538 A1 | 11/2011 |
| DE | 102011119610 A1 | 5/2013 |
| EP | 1154959 B1 | 10/2004 |
| JP | 2009116151 A | 5/2009 |
| WO | WO-0138240 A1 | 5/2001 |
| WO | WO-0217016 A1 | 2/2002 |

OTHER PUBLICATIONS

"German Application Serial No. 10 2017 213 070.9 Examination Report dated Feb. 22, 2018", (Feb. 22, 2018), 10 pgs.

"International Application Serial No. PCT/EP2018/070215, International Search Report dated Nov. 27, 2018", w/ English Translation, (Nov. 27, 2018), 6 pgs.

"International Application Serial No. PCT/EP2018/070215, Written Opinion dated Nov. 27, 2018", (Nov. 27, 2018), 7 pgs.

"Chinese Application Serial No. 201880049871.9, Office Action dated Jul. 16, 2021", w English Translation, (Jul. 16, 2021), 19 pgs.

"Japanese Application Serial No. 2020-504212, Office Action dated Apr. 5, 2022", w/ English Translation, (Apr. 5, 2022), 13 pgs.

MEMS MIRROR ARRANGEMENT FOR DETECTING A LARGE ANGULAR RANGE

PRIORITY APPLICATIONS

This application is a U.S. National Stage Filing under 35 U.S.C. 371 from International Application No. PCT/EP2018/070215, filed on Jul. 25, 2018, and published as WO2019/020708 on Jan. 31, 2019, which claims the benefit of priority to German Application No. 10 2017 213 070.9, filed on Jul. 28, 2017; the benefit of priority of each of which is hereby claimed herein, and which applications and publication are hereby incorporated herein by reference in their entirety.

The invention relates to a MEMS mirror arrangement for detecting a large angular range and to a method for manufacturing a MEMS mirror arrangement.

MEMS mirror arrangements which are used for example as scanners, in projectors, in lidar (light detection and ranging) systems and the like and which comprise at least one mirror which is suspended for example on torsion springs in a single-axis or double-axis manner are generally known from the state of the art and are preferably manufactured on a wafer level since the assembly of individual mirror arrangements which are provided with a housing entails high costs. Herein, several MEMS components are manufactured on a wafer which in a subsequent working operation is connected, for example by way of bonding, to a further wafer which comprises a multitude of housing covers. The wafer stack is subsequently divided into individual components for example by way of sawing. Not only does this procedural manner permit a very efficient packaging of all components, but also significantly simplifies the testing of the components, since all necessary tests can still be effected on the wafer level with suitable wafer samples.

Whereas wafer level packaging (WLP) in the field of micro-mechanical sensors in the meanwhile has advanced to standard technology, the packaging of optical components and systems on the wafer level is still comparatively rare. This above all is due to the restricted possibilities to this date of designing small optical housings according to functional aspects or of meeting all demands concerning the optics, electronics and thermal management. A series of specific demands results on capping optical components and systems and these demands have a direct affect on the design and orientation of the optical window surfaces. Thus e.g. inclined window surfaces are always necessary if reflections trigger disturbances. For example, a method for manufacturing structured optical components, concerning which method MEMS packaging is used amid the application of oblique housing windows, is known from DE 10 2011 119 610.

The housing shapes for MEMS mirror arrangements usually comprise optical entry and exit windows which are constructed from planar or planar-parallel surfaces. However, housings for optical systems which are to detect or scan a larger angular range also always require large and extended window surfaces. The large housing shapes which this entails however cannot be accepted for a wafer level housing from an economical point of view, since large parts of the used wafers cannot be used for manufacturing further components. It is conceivable for a dome-shaped cover shape which permits a space-saving design of housings with a large visual field to be able remedy this.

Otherwise, until now essentially planar-parallel arrangements have been used for the construction of optical systems on the wafer level, since there is a lack of suitable technologies for the 3D-structuring of the hermetical sealed housing structures of glass or silicon, wherein these must furthermore be compatible with the joining method. Furthermore, window surfaces which not only avoid reflections but also provide large angular ranges for an incident and outgoing radiation must be provided for optical elements.

A method for manufacturing micro-balls of glass, concerning which method a plurality of blind holes are formed on a wafer, is known from U.S. Pat. No. 8,151,600. A plate of thermally deformable glass which covers the blind holes is connected to the wafer. The arrangement is subsequently heated, by which means the pressure in the blind holes changes and the glass above the blind holes is inflated into a ball.

It is the object of the invention to provide a MEMS mirror arrangement with a large angular range for radiation which is incident on the mirror and is reflected by this and a method for manufacturing a MEMS mirror arrangement with a large angular range for incident and emerging radiation, said method being relatively simple to realize, so that the MEMS mirror arrangement is inexpensive to manufacture.

According to the invention, this object is achieved by the features of the independent device claim and the method claims.

Advantageous further developments and improvements are possible by way of the measures which are specified in the dependent claims.

The MEMS mirror arrangement for detecting a large angular range of up to 180, preferably up to 160 comprises a mirror which oscillates about at least one axis and is suspended in a hermetically tight chamber, said chamber being delimited by the transparent cover and the carrier substrate, wherein the middle of the mirror is arranged in the centre point of a dome which forms the transparent cover. Herein, the middle points of the mirror and of the base surface of the dome do not differ from one another by more than ±20% with respect to the diameter of the base surface. A uniformity for all angular positions of the mirror is achieved by way of this arrangement. The dome has an ellipsoidal cross-sectional surface which rises above an essentially circular base surface, wherein minimal deviations from the circular shape can occur. The dome comprises an inner and an outer boundary surface, wherein the boundary surfaces define two dome shells. Ideally, these dome shells should have the same middle point.

However, in reality every three-dimensional structure can only be manufactured in an approximate manner, to the extent that it is possible for the two middle points of the dome shells not to coincide. Tolerance ranges can be defined for the relative position of the two middle points, and in the present case the ratio of the height F to the diameter D of the inner and/or outer dome shell, denoted as the aspect ratio, lies between 0.4 and 0.6 and the difference of the aspect ratios between the inner dome shell and the outer dome shell lies between ±0.002. The range of ±10%, advantageously better than ±2% is specified for the offset of the base surface middle point of the inner and outer coupling shell of the dome in the vertical and horizontal direction.

An ideal spherical dome cannot be produced with the desired method of glass flow or glass blowing, in contrast the shape is always elliptical, i.e. at least one of the two boundary surfaces does not have a spherical surface and can only be described by an ellipsoid. Herein, the base surface of the ellipsoid is essentially a circular disc. The dome is ideally rotationally symmetrical about an axis which is aligned through the middle point of the base surface perpendicularly to this. For this reason, at least one of the cross-sectional surfaces of the inner or outer coupling shell which are orientated perpendicularly to the base surface has an elliptical shape. Such an elliptical dome no longer has perfect imaging characteristics. The laser beam is additionally distorted due to the elliptical shape, i.e. the wave front is deformed. Herein, two types of error are of particular relevance: on the one hand the change of the focal length over the angular range of the mirror (change of the focus position Z3 in the Wyant Zernicke notation of the terms of the Zernicke polynomial expansion), and the astigmatism (Zernicke coefficient Z4 and/or Z5 corresponding to the Wyant Zernicke notation of the terms of the Zernicke polynomial expansion) which refracts the laser beam to a different extent due to the different local curvatures of the surface. Herein, the focal length as well as the astigmatism changes continuously with the angular deflections of the mirror. Above all, the astigmatism worsens the optical imaging characteristics and has a particular significance for the resolution capacity of the mirror scanner or mirror projector and herewith for the design of the domes.

The errors in the imaging characteristics are minimised by the MEMS mirror arrangement according to the invention and an adequately good resolution capacity of a scanner with the mirror arrangement can be achieved over its complete operating range, wherein the achievable focus is smaller than 20 cm diameter at a 120 m distance, which corresponds to a maximally allowable divergence of the laser beam of smaller than 0.1. In order to meet these demands, the average deformation of the wave front (RMS) of the laser beam must be smaller than 0.5*wavelength (given a laser wavelength of 905 nm), in particular the magnitude of the primary astigmatism (Z4 and/or Z5) must be smaller than 0.4*wavelength.

Whilst taking these demands into account, the ellipsoidal dome must meet certain geometric criteria for this, so that the optical distortions which are unavoidably caused by the astigmatism of the ellipsoidal dome still permit a sufficiently good optical imaging over the complete angular range. What is critical in this context is the size of the aspect ratio of the two dome shells and the difference of the aspect ratios between the inner and the outer dome shell. In this context, the ratio of the vertical semi-axis of the ellipse to double the semi-axis of the ellipse parallel to the base surface of the vertical cross section through the ellipsoid of the respective dome shell is to be understood as the aspect ratio. In order to meet the aforementioned optical demands, as already specified above, the aspect ratio of the inner and/or outer dome shell should lie between 0.4 and 0.6 and the difference of the aspect ratios between the inner dome shell and the outer dome shell should not exceed a value range of ±0.002. Since with a larger mirror an increasingly larger part is illuminated by the laser beam within the dome, the magnitude of the astigmatism also increases with the ratio between the mirror size to the dome size. For this reason, the mirror should not exceed a size of 80% of the diameter of the base of the dome. It is even more advantageous if the mirror diameter does not exceed a magnitude of 60% of the diameter of the dome base. If the mirror is larger than 80% and in particular larger than 60% of the dome diameter, the imaging error which is caused by the astigmatism of the ellipsoidal shape becomes too large and leads to larger divergences of the laser beam.

The diameter of the mirror can therefore lie between 5% and 80% of the diameter of the base surface of the dome. It can be selected between 0.2 mm and 30 mm, preferably between 1 mm and 30 mm.

Even with ideal geometric conditions, an ideal spherical dome effects a constant beam divergence over the complete angular range of the mirror. This basically also applies to the elliptical domes with at least an ellipsoid surface, even if only approximated. Furthermore, apart from the angularly constant refraction, components which change in an angularly dependent manner also occur, such as the already mentioned change of the focus position (Z3), and further imaging errors, such as the mentioned astigmatism (Z4, Z5).

Whereas no deflection of the beam occurs for a beam of the beam bundle which is incident onto the mirror, said beam bundle running precisely from the middle of the mirror, i.e. from the dome middle to the outside and therefore being perpendicularly incident onto the arcuate surface of the semi-shelled spherical or ellipsoidal dome, axis-parallel beams which run parallel to the central beams undergo a deflection. The reason for this is a refraction which these beams undergo on entry into the higher refractive medium of the dome and which leads to the location, at which the beam enters into the dome, locally having a different inclination that the location at which the beam exits again. The magnitude of the beam deflection which is caused by way of this is herein determined by the local inclination angle, at which the beam is incident onto the dome, and by the magnitude of the beam offset which is caused by the refraction.

Whereas the local inclination angle is determined by the diameter of the complete beam bundle and the size of the dome, the magnitude of the beam offset depends on the refractive index of the material of the dome as well as its thickness.

The focal length of an ideal spherical dome with a constant wall thickness results as:

$$f = -\frac{n}{2(n-1)} \cdot \frac{R(R-d)}{d}$$

wherein n is the refractive index, d the wall thickness of the dome and R the radius of the dome.

Finally, since all further deviations of the dome shape from the desired shape, whether spherical or elliptical, inherent of manufacture, which lead to a change of the optical characteristics or the refractive power of the dome, scale with the reciprocal or even with the squared reciprocal value of the focal length, a large as possible focal length is desired, which given a predefined maximal radius of the dome can only be achieved by a small as possible wall thickness. However, the wall thickness cannot be reduced arbitrarily, since for example the dome must also be in the position of permanently withstanding a differential pressure of at least 1 bar when a vacuum prevails in the inside of the dome. A semi-shelled spherical or ellipsoidal shape of the dome is particularly suitable for accommodating pressure forces and leading then away into the carrier substrate. It has been found that a ratio of the square of the radius R of the dome to the thickness d of the wall of the dome larger than 50, i.e. $R^2/d > 50$ is also advantageous with regard to the tolerances of the manufacturing method.

The beam divergence which occurs due to the dome, possibly also a beam convergence, must be compensated, in order to meet the high demands placed upon the resolution e.g. of a lidar system or of a projector, for which the MEMS mirror arrangement according to the invention is used. The compensation optics which are provided for this collimate the laser beam in front of the dome in a manner such that an essentially parallel laser beam is present again after running through the dome and after the reflection by the mirror.

According to the invention, the compensation optics are designed as one or more lenses and/or as one or more hollow mirrors. Optics which utilise convex and concave surfaces, preferably one or more concave-convex lenses are particularly high-performance.

The dome can consist of glass, including quartz glass and/or silicon dioxide, but also preferably of a material which has a thermal coefficient of expansion which is adapted to silicon.

The compensation optics should be designed in a manner such that the smallest beam diameter of the incident radiation lies on the mirror, i.e., the optics should not effect an additional beam necking of the laser beam, in particularly none which lies in front of the mirror. Failing which, the magnitude of the diffraction which leads to an additional beam divergence is determined by the waisting of the laser beam and not by the micromirror.

The focal length of the compensation optics results as:

$$f_{comp} = -f_{dome} + a$$

wherein a is the distance between the image-side main plane of the dome and the object-side main plane of the compensation optics.

In the embodiment example of the present invention, the focal length of the dome can correspond approximately to and with the opposite sign of the focal length of the compensation optics. This is a certain approximation since, as is to be derived from the formula, the distance a between the two optical main planes of the dome and of the compensations optics also enters into the equation. However, the distance compensation optics—mirror is small compared to the focal length of the dome, so that the approximation is allowable.

In a preferred embodiment example, the focal length of the dome can lie between 50 mm and 300 mm.

The method for manufacturing a MEMS mirror arrangement according to the above embodiments, concerning which method a transparent cover is hermetically closed by a carrier substrate, on which a mirror which oscillates about at least one axis is suspended, comprises the following steps: providing a silicon wafer, structuring the silicon wafer in a manner such that a plurality of deepenings which each correspond to the base surface of the cover are created, bonding a cover wafer of glass-like material onto the structured silicon wafer, wherein an inert gas is enclosed at a predefined pressure in the cavities which are formed by the deepenings and the cover wafer, tempering the composite of the silicon wafer and the cover wafer in a manner such that a plurality of domes is formed by way of the expansion of the enclosed inert gas, after cooling the composite of the silicon wafer and the cover wafer partial or complete removal of the silicon wafer, arranging a mirror wafer which comprises a plurality of mirrors which are suspended on the carrier substrate, with respect to the cover wafer in a manner such that the mirror middles each lie in the middle point of the domes, joining and hermetically sealed closing of the cover wafer with the mirror wafer by way of bonding with additively deposited layers or structures, singularising the composite of cover wafer and mirror wafer into individually capped MEMS mirror arrangements.

In another embodiment of the method according to the invention, a tool is used instead of a silicon wafer, said tool consisting of a material which prevents an adhesion of a hot, glass-like material or being coated with a material which prevents an adhesion of a hot, glass-like material. This tool is or will be provided with through-openings. A cover wafer of glass-like material is applied onto the tool which is provided with through-openings and a vacuum is applied at the side facing away from the cover wafer. The tempering of the composite of the tool and cover wafer is effected under atmospheric conditions in a manner such that a plurality of domes is formed by way of sucking the cover wafer into the through-openings on account of the vacuum. The tool is removed after cooling the composite of the tool and cover wafer. The further steps correspond to those of the previously described method.

The mirror arrangement according to the invention for detecting a large angular range, said arrangement being manufacturable by way of the embodiments of the described methods, as specified above comprises a carrier substrate which is the constituent of the mirror substrate or of the mirror wafer which is described concerning the method and on which a mirror which oscillates about at least one axis is suspended, a transparent cover which is connected to the carrier substrate in a hermetically tight manner and comprises a dome with planar regions which connect thereto, and compensation optics which are arranged in a predefined beam path for an incident beam bundle outside the dome, wherein the middle of the mirror lies in the middle point of the dome, and wherein the compensation optics collimate the incident beam bundle in a manner such that a divergence or convergence of the beam bundle, caused by the boundary surfaces of the dome, is at least partly compensated.

A cover shape according to the invention, for the MEMS mirror arrangement, which permits a large field of view, possibly up to 180 without the chip surface or the carrier substrate having to be unnecessarily large, can be manufactured by way of the method according to the invention. The carrier substrate or the chip surface of the MEMS mirror arrangement is therefore not determined by the necessity of the optics. The method according to the invention moreover permits an inexpensive manufacture of a multitude of MEMS mirror arrangements.

The manufacture is effected by way of glass flow. For this, on anodically bonding the glass wafer onto the structured silicon wafer, a pressure of 100 mbar to 3 bar, preferably of 1 bar to 1.2 bar of an inert gas, typically nitrogen is enclosed in the cavities.

The tempering under a vacuum is particularly advantageous, by which means quite high domes can be created without necessitating very deep silicon cavities or high gas pressures in the cavities. A force should no longer be exerted onto the dome during the cooling after the tempering. If the actual tempering was not effected in vacuum, then it is advantageous for the gas pressure within the oven to track the temperature in accordance with the ideal gas equation, in order to herewith avoid a renewed flowing of glass of the dome and, entailed by this, a shape change during the cooling.

According to the invention, the tempering under a vacuum is carried out at 650 C-950 C, preferably at 700 C-800 C, even more preferably at 710 C, wherein it is completed after a defined time of 30 minutes to 12 hours, preferably after about 2 hours and cooled under a vacuum. Basically, the tempering should be effected such that the shape slowly approximates the desired final dome shape. A low flow speed towards the end of the tempering process leads to particularly good, almost spherical surface shapes on account of the effect of the surface tension. Herein, the parameters depth of the deepenings of the structured silicon wafer, pressure of the gas which is enclosed in the cavities, temperature of the tempering and the time of tempering are controlled such that the flow speed of the glass-like material is lower than 0.5 mm per hour towards the end of the tempering, preferably during the last 20% of the tempering time. The desired dome shape is essentially achieved in this manner.

Concerning the method with the use of a tool with through-openings, the parameters differential pressure between the atmospheric pressure and the negative pressure on the side of the tool which is opposite to the cover wafer, the temperature of the tempering and the time of the tempering are controlled or the differential pressure tracked, such that the flow speed of the glass-like material is smaller than 0.5 mm per hour towards the end of the tempering, preferably during the last 20% of the tempering time. The desired dome shape is essentially achieved in this manner.

After completion of the actual glass shaping process, the silicon is partly or completely removed, wherein this can be effected mechanically or, due to the very high topography of the domes, can be carried out by way of wet-chemical means, e.g. with a hot caustic potash, by way of etching away.

By way of the mechanical expansion of the glass with the glass flow, the wall thickness of the dome is approx. 50% of the initial glass substrate. Despite this, correspondingly thin glass substrates with thicknesses in the region of 200 μm or even less are also necessary for the manufacture of very thin-walled glass domes with a wall thickness for example of 1 μm to 0.5 mm. Usually, such thin glass substrates can no longer be reliably handled on account of danger of breakage which is entailed by this. However, it has been found that in the case of the used glass cover wafer, this glass wafer or cover wafer obtains a high degree of mechanical stiffness and stability due to the incorporation of the very high dome structures. However, since the domes needs to be arranged in a fixed raster over the respective wafer, in order to be able to ensure the subsequent sawing into individual chips or components, axes which do not profit from the mechanical stiffening by way of the domes arise within the cover wafer. Here, additional, long cylindrical structures which are formed between the domes, and peripheral spire-like structures in the edge region of the wafer, ensure the necessary additional stability and stiffness.

The components which are used need to be anti-reflected for most optical applications. For this, as a rule a sequence of thin (λ/4) layers are deposited onto the optical surface of the domes after the tempering and removal of the silicon wafer or of the tool. CVD methods, i.e. chemical precipitation from the gas phase can be used and so-called ALD (atomic layer deposition) appears to be particularly suitable here, since a high trueness of shape is given and the layer thickness of the coating does not vary over the dome.

The joining and the hermetically sealed closing of the cover wafer and of the mirror wafer can be realised by way of depositing a sealing material peripherally around each dome structure onto the cover wafer and/or onto the mirror wafer and by way of subsequent so-called additive bonding, concerning which additively deposited layers or structures are used.

Additive wafer joining methods (=wafer bonding) utilise additional structures of metal or glass which are deposited onto the substrates, in order to be able to join silicon or glass substrate. Hereinafter, it is especially always frame structures which frame the actual useable MEMS structures which are meant by hereinafter.

Concerning the actual bonding, the MEMS structures are then closed in a hermetically tight manner, i.e. permanently sealed with respect to the penetration of gases or humidity. In particular, by way of this, a negative pressure or vacuum is retained in the thus closed volumes over years and decades.

Examples of wafer bonding with additive methods are the so-called glass frit bonding, concerning which a paste of a very low-melting glass is printed on one of the joining partners by way of screen printing and is subsequently peripherally melted into a closed frame. The subsequent bonding of the wafers is then typically effected at temperatures of 420 C-450 C. Herein, the wafers are pressed together, in order to achieve a secure contact over the whole wafer surface.

Another very important method is the so-called eutectic bonding with metallic alloys. Ultimately, it is a soldering of the two joining partners, concerning which the metals have been precipitated on at least one of the wafers/substrates and subsequently structured. Herein, either the actual alloy of the solder can be deposited on one of the two wafers (e.g. gold-tin solder) or however the alloy is present in the form of layers which are separate from one another, and not until bonding forms the actual alloy which herein also melts at least in the contact zone of the two wafers. The different individual layers of the components of the alloy of the solder can herein either be arranged on one of the two wafers or however deposited onto both wafers in a distributed manner.

Hence for example the soldering with gold-tin can also be effected by way of the required tin being deposited on one of the two wafers and the gold being deposited on the other and these not reacting with one another and forming a molten phase until the contact and heating of the two wafers.

In practise however, this procedure is only applied to gold-silicon bonding, wherein the fluid gold-silicon eutectic arises at temperatures above 363 C when the gold of the bonding frame on the one wafer is brought into contact with the silicon of the other wafer.

In all these cases, the material in the joining zone is at least temporarily fluid or however is very soft (glass solder) during the bonding and is therefore capable of compensating unevenness. The strength is not achieved until after the cooling, by way of the solder connections solidifying.

A special glass of bonding methods are methods which utilise the plastic deformation of soft metals. For this, metallic frame structures are likewise created onto both joining partners, for instance by way of vapour deposition and etching or by way of a galvanic precipitation. The two wafers are subsequently pressed together under a high pressure and temperature, wherein the frame structures are literally squeezed together (=thermocompression bonding).

In contrast, all other wafer joining methods are based either on chemical reactions during the bonding and herein utilise the substrate characteristics (anodic bonding, fusion bonding).

In cases in which the joining zones on the mirror wafer as well as the cover wafer are very smooth and planar, hermetically sealed joining methods which make do without an additional sealing material in the joining zones can be used, in order to achieve a hermetically sealed closure between the two wafers. Apart from direct wafer bonding which is ultimately based on the wringing together of surfaces which are smooth as glass, it is above all the anodic bonding which is considered for this, concerning which the glass surface reacts with silicon and is joined in a hermetically sealed manner by way of an electrochemical process. Herein, an oxidation of the silicon surface is brought about at temperatures of between 300 C and 450 C by way of applying an electrical voltage of a few 100 V between the glass of the cover wafer and the silicon, said oxidation finally welding both surfaces to one another in an inseparable manner.

If the surfaces of the cover wafer or mirror wafer do not need to be adequately planar or smooth (<10 nm) then the actual sealing materials must be deposited according to the so-called additive bonding before the sealing of the mirror wafer with the cover wafer. In an embodiment example, a printable sealing material, preferably a meltable solder is used as a sealing material. This printing-on of the joining layer or at least its structuring is particularly preferable from an economic and technical point of view, also whilst taking into account the high topography of the cover wafer. Above all, it is the printing-on of low-melting glass solders which is to be mentioned here, since hereby only one of the two joining partners needs to be printed with the glass solder which is designed as glass paste, which as a rule is the cover wafer on account of process-technological advantages.

In an advantageous manner, the sealing material is deposited on joining zones between the cover wafer and the mirror wafer, wherein in an embodiment example, for leading away the pressure forces on bonding, the joining zones lie directly below the walls of the domes. The spherical shape of the surface is very suitable for accommodating acting pressure forces and leading them away into the mirror wafer. For this reason, the joining zones of the two wafers can encompass the region directly below the domes. Otherwise, given an offset of the joining zones, considerable mechanical stresses could indeed occur in the transition zone between the walls of the dome and the planar region of the cover wafer.

It is advantageous that the necessary pressure forces are deposited in a pointwise or linear manner on joining or bonding the cover wafer and mirror wafer. On account of the high topography of the cover wafer, the concluding bonding procedure needs to be modified vis-à-vis the established methods. Since the wafers as a rule need to be pressed onto one another during the bonding but the optical surfaces where possible are not to be mechanically loaded in order to avoid damage, the mechanical pressure is only applied in a pointwise manner and not over the whole surface. For example, the pressure can be applied upon up to 25 locations which are distributed over the wafer, with the help of tools. The mechanical stiffness of the wafer adequately distributes the introduced pressure over the whole wafer, so that all housings, consisting of the covers which comprise the domes and of the carrier substrate, on the wafer, can be closed in a hermetically sealed manner.

Another possibility of the bonding of the cover wafer or of the mirror wafer lies in them being sealingly connected to one another at the edge regions and the bonding subsequently being carried out in a pneumatic manner. Hence the wafer or wafers are firstly annularly connected at the wafer edge, so that the waver stack is closed off in a vacuum-tight manner, and the actual bonding can then take place in a purely pneumatic manner. For this, the wafer is heated under atmospheric pressure either when it is still in the bonder or in a subsequent oven step, by which means the joining material softens again and the two wafers are pressed onto one another by way of the pneumatic pressure which is loaded on.

The wafer which forms the carrier structure or the carrier substrate for the individual mirrors as well as a rearward mirror which is connected to the wafer of the carrier structure are denoted as mirror wafers. Herein, the connecting can be carried out in a step which is separate from the bonding or also together with the bonding of the cover wafer.

Embodiment examples of the invention are represented in the drawing and are explained in more detail in the subsequent description. There are shown in FIG. 1 a section through the mirror arrangement according to the invention and according to a first embodiment example, wherein the compensation optics have been omitted, FIG. 2 a representation according to FIG. 1 with compensation optics and a beam path, FIG. 3 a method sequence according to the steps a) to g) for the manufacture of the mirror arrangement according to the invention and according to the first embodiment example, FIG. 4 a method sequence according to the steps a) to e) for the manufacture of the mirror arrangement according to the invention and according to a further embodiment example and FIGS. 5a) and 5b) a view and a section onto a wafer with a multitude of mirror arrangements.

The part of the mirror arrangement which is represented in FIG. 1 comprises a carrier substrate 1, on which in the known manner a mirror 2 is suspended in a single-axis or two-axis manner via springs 3 which are represented in a dashed manner and which can be designed for example as torsion springs. The mirror 2 is driven via a drive which is not represented, for the rotation or for the pivoting about the mirror middle point. The carrier substrate 1 can consist of several substrate layers, in the present example of two substrate layers, and can possibly also be designed in one part.

A housing cover 4 is connected to the carrier substrate 1 in a hermetically sealed manner via joining zones 5, wherein the housing cover 4 comprises a desired semi-shelled, spherical or ellipsoidal dome 6 of a material which is transparent to a desired incident and exiting radiation. For example, the dome 6 can consist of a glass material, where the glass is transparent to visible radiation. Ideally, the material of the dome should have a thermal coefficient of expansion which is adapted to silicon, in order to avoid thermodynamic stresses after the temperature-related joining process. Planar regions 7 connect onto the domes 6 and the joining zones 5 are positioned such that they are provided below the dome wall at the transition locations of the dome 6 to the planar regions 7.

As specified, an ideal hemispherical dome 4 is sought after, this however not being achievable with the applied manufacturing method which is described hereinafter. For this reason, the dome 4 has an elliptical shape with a circular base surface or floor surface. Herein, at least one of the boundary surfaces which are denoted as an inner 9 and outer coupling shell 10 are elliptical, mostly this is the case with both boundary surfaces, by which means imaging errors arise, above all astigmatisms, wherein the magnitude of the astigmatisms determines how well the laser beam can yet be focused at all. The size of the focus however determines the achievable resolution capacity (number of picture points) of the scanner or projection which uses the mirror arrangement. For this, the dome shape must lie within a certain characteristic geometric parameter range. Definitions for the dimensions are specified in FIG. 1 for determining this or the parameter regions.

Fi is the vertical semi-axis of the inner elliptical dome shell or the vertical distance between the middle point of the ellipse and the dome interior. Fa is the vertical semi-axis of the outer ellipse or the vertical distance between the middle point of this ellipse and the outside of the dome.

$D_i$ is the inner diameter of the dome or the large axis of the cross section ellipse. $D_a$ is the outer diameter of the dome or the large axis of the cross section ellipse.

$t_t$ is the thickness of the dome shell at the apex point. $t_b$ is the thickness of the dome shell at the base.

$M_i$ is the middle point of the elliptical dome cross section of the inner dome shell. $M_a$ is the middle point of the elliptical dome cross section of the outer dome shell.

$b_i$ is the distance between the middle point of the elliptical inner dome shell and the mirror surface. $b_a$ is the distance between the middle point of the elliptical outer dome shell and the mirror surface.

$D_s$ is the diameter of the mirror.

The so-called aspect ratio $F_{i(a)}/D_{i(a)}$ of the inner 9 and outer 10 dome shell lies between $0.4<F_iD_i$ and $F_a/D_a<0.6$ respectively and the difference of the aspect ratios $F_a/D_a-F_i/D_i$ must lie between $0.002<F_a/D_a-F_i/D_i<0.002$. The maximal thickness of the dome 6 should herein be smaller than 10% of the diameter of the dome 6, in the present case of the diameter $D_i$ of the base surface, at every location. These characteristic variables are valid as long as the mirror diameter is not too large in relation to the dome diameter, i.e. the mirror diameter $D_s$ should lie in a region of $0.05<D_s<0.8$ in relation to the diameter $D_i$ of the base surface of the dome 6.

The mirror 2 should be positioned such that the middle point of the mirror lies in the middle of the round base surface of the dome 6. Herein, the middle points $M_i$, $M_a$ should not differ from one another by more than ±20% with regard to the diameter $D_i$ of the base surface. The middle points $M_i$, $M_a$ of the elliptical cross-sectional surfaces of the inner 9 and outer 10 dome shells should also not differ by more than ±20% from the middle point of the mirror in the vertical direction, always in relation to the base surface or floor surface of the dome 6.

An electrical connection pad 13 for the activation of the mirror 2 is represented in FIG. 1 at 13. A cylindrical dome 14 of glass is formed above the connection pad and is a constituent of the glass wafer and is opened by sawing on singularising into the wafer chips or into the individual mirror arrangements.

Figure 2:
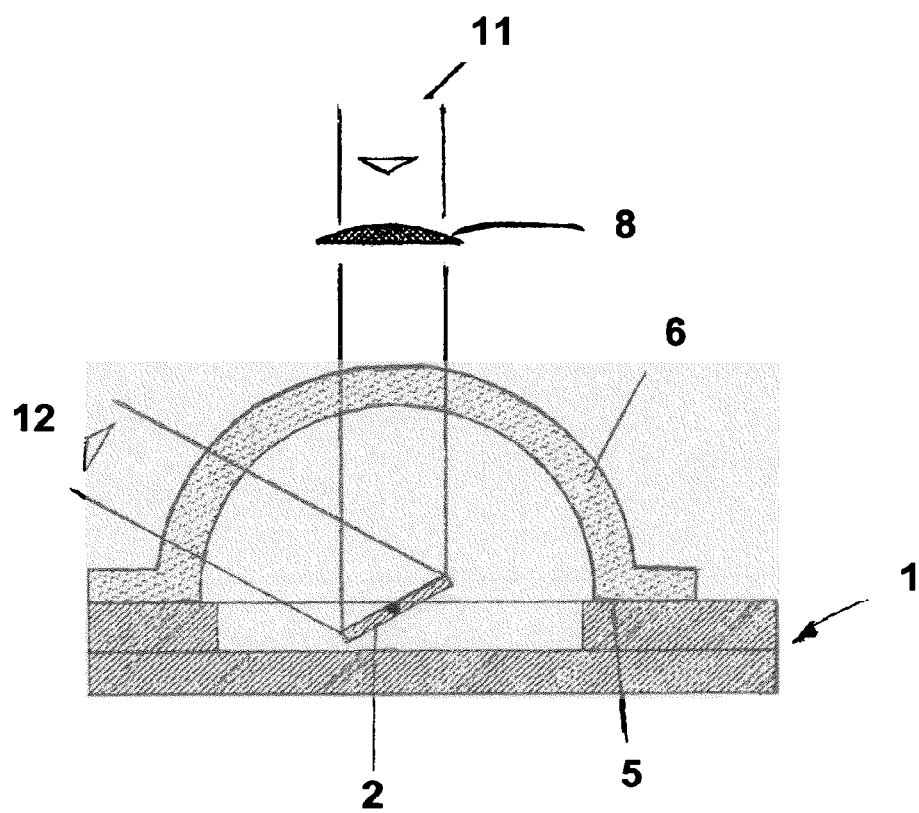
Figure 3:
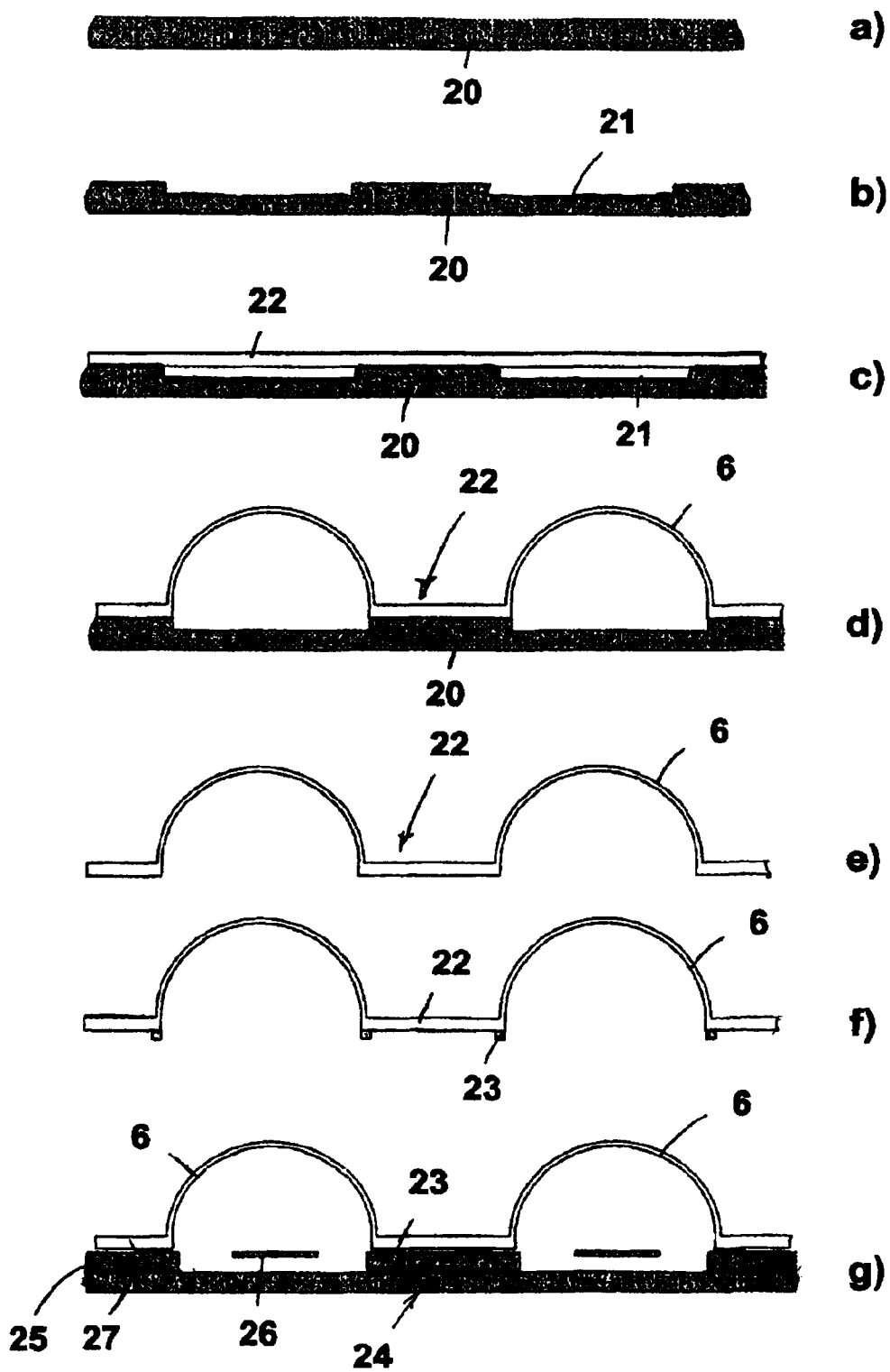

In order to compensate a beam divergence which occurs due to refraction at the dome 6, according to FIG. 2 compensation optics 8 are arranged in front of the dome 6, said compensation optics in the present case being designed as a convex lens. In FIG. 2, the beam path 11, 12 is only shown schematically and does not show the course which deviates from the parallel beam path. The compensation optics 8 collimates the incident beam bundle 11 in a manner such that the smallest beam diameter of the incident radiation lies on the mirror 2 and that a divergence of the beam bundle which is caused by the dome-shaped boundary surfaces, the inner dome shell 9 and the outer dome shell 10 of the dome 6, acting as a scatter lens is essentially compensated after the exit out of the dome 6 and exits as a parallelised beam 12. For this, the middle of the mirror 2 lies in the middle point of the dome 6. Such a mirror arrangement according to FIGS. 1 and 2 can be used for scanners, projections, lidar systems and the like.

In FIGS. 3a) to 3g), manufacturing steps for the mirror arrangement according to FIG. 1 are represented. According to FIG. 3a), a silicon wafer 20 is provided, said silicon wafer being provided with deepenings 21 by way of structuring, preferably by way of high-rate etching, wherein the deepenings have a height for example of 200 μm (FIG. 3b)). A glass wafer or cover wafer 22 is bonded onto the silicon wafer 20 with the structured recesses 21, preferably at a pressure of 1.2 bar, wherein the cavities, i.e. the closed-off deepenings 21 are filled with an inert gas, preferably nitrogen $N_2$.

This arrangement according to FIG. 3c) is tempered under a vacuum in a tempering oven, for example at temperatures between 700 C and 800 C, by which means the glass softens up to the flow velocity, and the dome 6 is formed by the pressure changes in the cavities. During the tempering, the shape of the flowing glass substrate 22 approximates the dome shape and so that a particularly good spherical surface shape is produced and specifically amid the action of the surface tension, the flow speed of the glass material is less than 0.5 mm per hour during the last 20% of the tempering time. The process is completed after about 2 hours and the arrangement of deformed glass wafers or cover wafer 22 and silicon wafer 20 is cooled in the oven, preferably under a vacuum and subsequently vented (FIG. 3d)). After completion of the glass forming process, the silicon substrate 20 is partly or completely removed, as is shown here below FIG. 3e). This can be carried out mechanically or however also by way of wet-chemical means.

The arrangement according to FIG. 3e), i.e. the deformed glass wafer 22 is usually provided with an anti-reflection coating on both sides, i.e. on the inner surface of the domes 6 as well as on the outer surface of the domes 6, by way of ALD, which can be a sequence of thin λ/4 layers. Subsequently, a low-melt glass solder 23 is printed on as a glass paste and specifically at the intended joining zones 5 at the transition of the domes 6 to the plane surfaces 7 of the glass wafer 22 (see FIG. 3f)). The joining zones hence lie directly below the wall of the domes 6. The glass solder 23 is tempered and glazed, and the glass wafer 22 which is provided with the domes 6 is subsequently connected as a cover wafer to the premanufactured mirror wafer 24 by way of bonding, wherein the cover wafer and the mirror wafer 24 are pressed onto one another via an auxiliary structure which is placed thereupon. The mirror wafer has been prepared from the very beginning and can consist of the actual carrier substrate 25 for the mirror 26 and of a rearward substrate 27. Such an arrangement is shown in FIG. 3g). In a last step, the arrangement according to FIG. 3g) is divided into a plurality of MEMS mirror arrangements for example by way of sawing.

Figure 4:
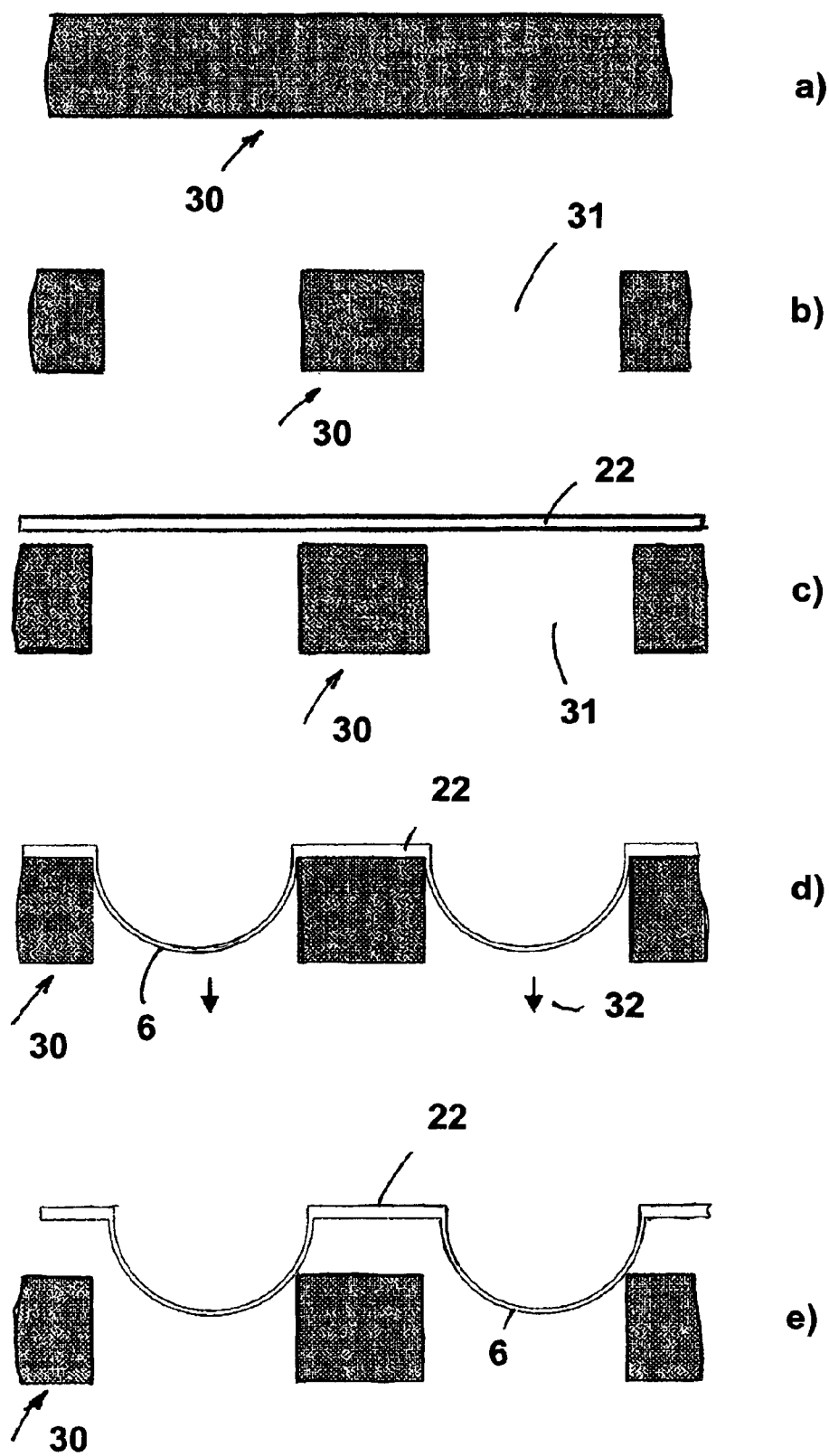

A schematic process sequence for manufacturing the cover wafer is represented in one variant in FIG. 4, wherein a negative pressure forming is applied on a reusable tool.

According to FIG. 4a), an untreated tool 30 is provided, said tool in accordance with FIG. 3b) being provided with through-openings 31 which comprise a base surface corresponding to the base surface of the domes to be produced. However, the tool can also be provided with through-openings from the very beginning. The material of the tool is a high-temperature-resistant steel, ceramic or glass (quartz glass) or the like, wherein the material is subsequently provided with a coating which prevents an adhering of hot glass on the tool, e.g. of boron nitride, graphite, diamond, amorphous carbon layers (DLC). However, the tool itself can also consist of materials which have a low tendency to stick to glass, such as boron nitride, SiC, glass carbon, diamond, graphite or the like, wherein it is graphite which is often used.

According to FIG. 4c), a glass wafer or cover wafer 22 is placed onto the tool 30 and a vacuum which is indicated by the arrows 32 is applied from the side of the tool 30 facing away from the cover wafer 22, wherein this can be effected by way of an attached vacuum chamber. Atmospheric pressure prevails on the side of the cover wafer.

The complete construction is subsequently tempered under atmospheric conditions, by which means the glass of the cover wafer 22 is sucked into the openings 31 and the domes 6 are formed (FIG. 4*d*)). Herein, the tempering is controlled such that whilst taking into consideration the tempering time and the temperature, the pressure difference between the atmospheric pressure and the negative pressure (vacuum) is reduced towards the end of the process. The manufacture of the cover wafer 22 is completed when the necessary height of the domes 6 is reached.

The cover wafer 22 is lifted from the tool 30 after venting the arrangement and the tool is ready for receiving the next wafer (FIG. 4*e*)).

The further steps correspond to those in FIGS. 3*f*) and 3*g*).

Figure 5:
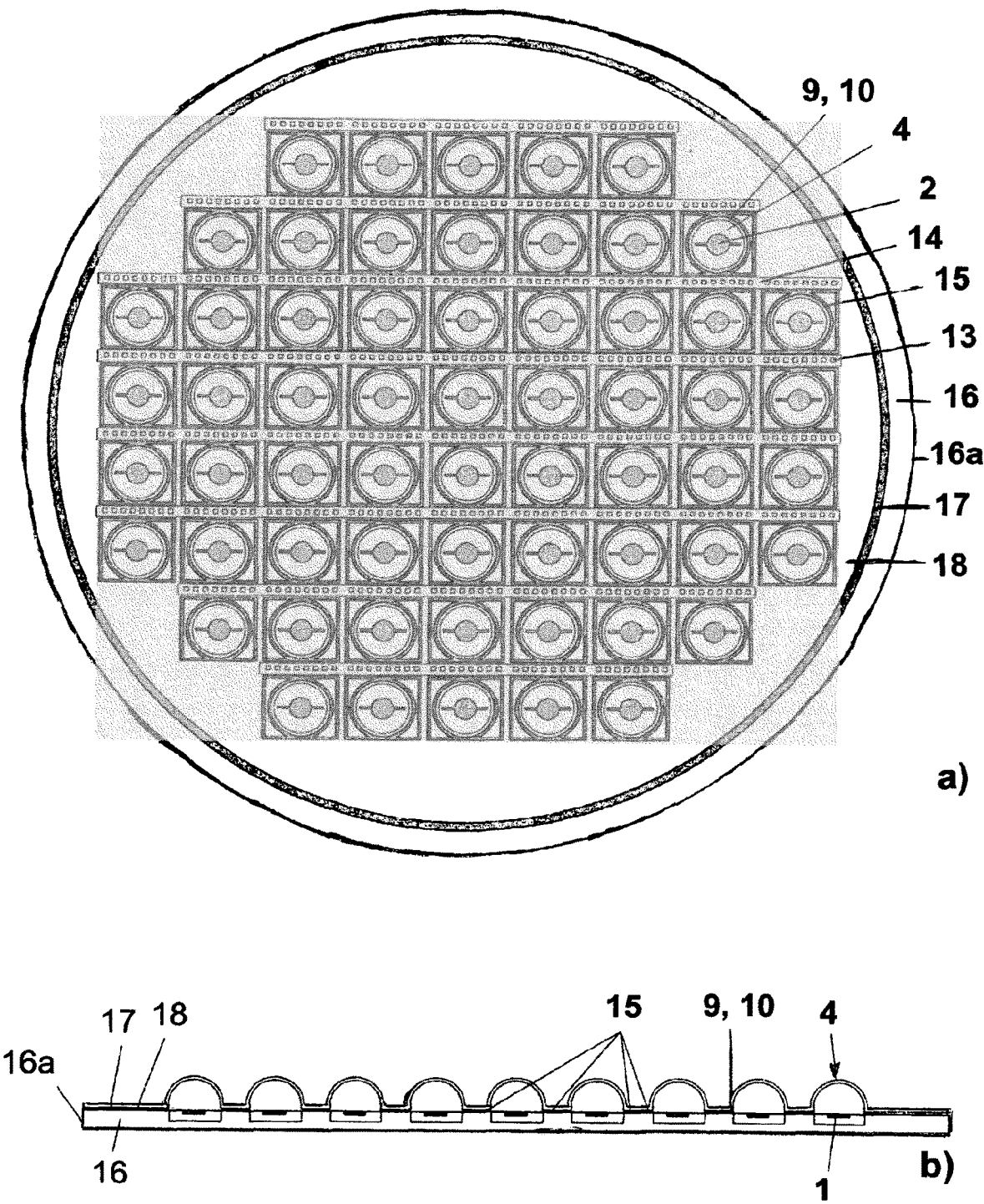

A view onto a wafer 16 and a schematic section through this wafer as a wafer composite with a multitude of individual mirror arrangements which are separated into different wafer chips are shown in FIGS. 5*a*) and 5*b*). The mirror arrangements or wafer chips are arranged on the round wafer 16 with the wafer edge 16*a* in parallel rows. The cylindrical domes 14 of glass lie above electrical connection pads 13 between the rows and these pads are later opened in particular for examining the individual mirror arrangements on the wafer composite.

The procedure of additive bonding can be explained by way of FIG. 5*a*). A bond frame 15 of a sealing material is deposited around the respective wafer chip or the mirror arrangement and around the dome 6. A further bond frame 17 is deposited around the periphery of the wafer 1, as a rule of silicon, close to its peripheral edge 16*a*. With pneumatic bonding, the wafers are connected to one another at the periphery firstly under a vacuum. This is effected by way of a mechanical pressure being locally exerted onto the wafer only in this region, with the help of an additional annular tool and at the process temperature. By way of this, the wafers are pressed together and sealed in a vacuum tight manner above all in this region. The bonder is subsequently vented with a gas, mostly nitrogen. Herein, the pneumatic pressure presses together the evacuated region between the two wafers, so that the bond frames are also pressed together between the individual chips and are connected to one another. Only afterwards are the wafers removed from the bonder. Wafers with non-planar surfaces can also be processed by way of this two-stage bonding process. In particular, on account of this, the necessity of exerting a mechanical pressure onto the wafer over a large area is rendered superfluous, which represents a huge advantage when sensitive optical surfaces as in the case of the domes need to be processed.

The invention claimed is:

1. A MEMS mirror arrangement for detecting an angular range of up to 180°, comprising:
    a carrier substrate on which a mirror which oscillates about at least one axis is suspended,
    a transparent cover which is connected to the carrier substrate in a hermetically sealed manner and which comprises a semi-shell dome with an ellipsoidal cross-sectional surface, said dome rising above an essentially circular base surface, wherein the dome is provided with an inner dome shell and an outer dome shell which form boundary surfaces and the ratio of the height F to the diameter D of the inner and/or outer dome shell is between 0.4 and 0.6 and the difference between the ratio of the height Fi to the diameter Di of the inner dome shell and the ratio of the height Fa to the diameter Da of the outer dome shell lies between ±0.002 and
    compensation optics which are arranged outside the dome in a predefined beam path for an incident beam bundle,
    wherein the middle of the mirror coincides with the middle point of the base surface of the dome with a maximum tolerance of ±20% of the diameter of the base surface of the dome and
    wherein the compensation optics collimate the incident beam bundle in a manner such that a divergence or convergence of the beam bundle, caused by the boundary surfaces of the dome, is at least partly compensated after exit from the dome.

2. The MEMS mirror arrangement according to claim 1, wherein the difference between the ratio of the height Fi to the diameter Di of the inner dome shell and the ratio of the height Fa to the diameter Da of the outer dome shell lies between ±0.001.

3. The MEMS mirror arrangement according to claim 1, wherein a ratio of the square of a radius R of the dome to a of the wall of the dome is larger than 50, $R^2/d > 50$.

4. The MEMS mirror arrangement according to claim 1, wherein a thickness of the wall of the dome is smaller than 10% of the diameter of the base surface of the dome.

5. The MEMS mirror arrangement according to claim 1, wherein the diameter of the mirror lies between 80% and 5% of the diameter of the base surface of the dome.

6. The MEMS mirror arrangement according to claim 1, wherein the deviation of the middle points of the base surfaces of the inner and outer dome shell (10) of the dome in the radial and vertical direction lies in the range of ±10 of the diameter of the base surface of the dome.

7. The MEMS mirror arrangement according to claim 1, wherein the material of the dome has a thermal coefficient of expansion which is adapted to the thermal coefficient of expansion of the material of the mirror.

8. The MEMS mirror arrangement according to claim 1, wherein the inner space between the dome and the carrier substrate, said inner space receiving the mirror, is under a vacuum or is filled with a protective gas.

9. The MEMS mirror arrangement according to claim 1, wherein the focal length of the dome corresponds approximately to and with the opposite sign of the focal width of the compensation optics.

10. The MEMS mirror arrangement according to claim 1, wherein the focal length of the dome lies between −50 mm and −300 mm.

11. A method for manufacturing a MEMS mirror arrangement according to claim 1, with the following steps:
    a) providing a silicon wafer,
    b) structuring the silicon wafer in a manner such that a plurality of deepenings is created,
    c) bonding a cover wafer of glass-like material onto the structured silicon wafer, wherein an inert gas is enclosed at a pre-defined pressure in the cavities which are formed by the deepenings and the cover wafer,
    d) tempering the composite of the silicon wafer and of the cover wafer in a manner such that a plurality of domes is formed by way of the expansion of the enclosed inert gas,
    e) after cooling the composite of the silicon wafer and the cover wafer, partial or complete removal of the silicon wafer,
    f) arranging a mirror wafer which comprises a plurality of mirrors which are suspended on the carrier substrate, with respect to the cover wafer in a manner such that the mirror middles each lie in the middle point of the domes, g) joining and hermetically sealed closing of the cover wafer with the mirror wafer by way of bonding with additively deposited layers or structures, h) singularising the composite of cover wafer and mirror wafer into individually capped MEMS mirror arrangements.

12. The method according to claim 11, wherein the tempering is carried out under a vacuum or that during the cooling after the actual tempering procedure in a gas atmosphere the gas pressure within a closed oven is tracked to the temperature change according to the thermal equation of state.

13. The method according to claim 11, wherein compensation optics are arranged outside the cover which includes a dome, in the beam path of a beam which is incident into the dome, said compensation optics at least partly compensating a divergence or convergence which is caused by the passage of the beam through the outer and inner boundary surfaces of the dome.

14. The method according to claim 11, wherein the inert gas is enclosed in the cavities at a pressure of 100 mbar to 3 bar on bonding the cover wafer onto the silicon wafer.

15. The method according to claim 11, wherein the tempering is carried out under a vacuum at 650°-950° C. and is completed after a defined time of 30 min-12 hours and is cooled under a vacuum.

16. The method according to claim 11, wherein the parameters depth of the deepenings of the structured silicon wafer, pressure of the gas which is enclosed in the cavities, temperature of the tempering and the time of tempering are controlled such that the flow speed of the glass-like material is lower than 0.5 mm per hour during the last 20% of the tempering time.

17. The method according to claim 11, wherein an anti-reflex coating is deposited onto the inner and/or outer surface of the domes after the tempering and removal of the silicon wafer or of the tool.

18. The method according to claim 11, wherein a printable sealing material is used as a sealing material on bonding.

19. The method according to claim 11, wherein the sealing material is deposited on joining zones (5) between the cover wafer and the mirror wafer, said joining zones lying directly below the walls of the domes for leading away pressure forces on bonding.

20. The method according to claim 11, wherein the pressure forces are exerted in a pointwise or linear manner on bonding the cover wafer and the mirror wafer.

21. The method according to claim 11, wherein the cover wafer and the mirror wafer are connected to one another in a sealed manner at their edge regions on bonding and that the bonding is subsequently carried out pneumatically.

22. A method for manufacturing a MEMS mirror arrangement, the method comprising:

a) providing a tool which consists of a material which prevents an adhesion of a hot, glass-like material or is coated with a material which prevents an adhesion of a hot, glass-like material, b) providing the tool with through-openings before or after the provision, c) laying the cover wafer of glass-like material onto the tool which is provided with through-openings, wherein a negative pressure is applied at the side which is away from the cover wafer, d) tempering the composite of the tool and of the cover wafer under atmospheric conditions in a manner such that a plurality of domes is formed by way of the sucking of the cover wafer into the through-openings, e) after cooling the composite of the tool and the cover wafer, removal of the tool, f) arranging a mirror wafer which comprises a plurality of mirrors which are suspended on the carrier substrate, with respect to the cover wafer in a manner such that the mirror middles each lie in the middle point of the domes, g) joining and hermetically sealed closing of the cover wafer with the mirror wafer by way of bonding with previously deposited layers or structures, h) singularising the composite of cover wafer and mirror wafer into individually capped MEMS mirror arrangements.

23. The method according to claim 22, wherein the parameter differential pressure between the atmospheric pressure and the pressure which is applied at the side facing away from the cover wafer as well as the temporal course of the pressure difference, the temperature of the tempering and the time of the tempering are controlled such that the flow speed of the glass-like material is smaller than 0.5 mm per hour during the last 20% of the tempering time.

* * * * *